(12) United States Patent
Chang

(10) Patent No.: US 8,623,678 B2
(45) Date of Patent: Jan. 7, 2014

(54) METHOD FOR MANUFACTURING LED

(75) Inventor: Chieh-Ling Chang, Hsinchu (TW)

(73) Assignee: Advanced Optoelectronic Technology, Inc., Hsinchu Hsien (TW)

( * ) Notice: Subject to any disclaimer, the term of this patent is extended or adjusted under 35 U.S.C. 154(b) by 11 days.

(21) Appl. No.: 13/569,117

(22) Filed: Aug. 7, 2012

(65) Prior Publication Data

US 2013/0095583 A1    Apr. 18, 2013

(30) Foreign Application Priority Data

Oct. 17, 2011    (CN) .......................... 2011 1 0314534

(51) Int. Cl.
*H01L 21/00*    (2006.01)
(52) U.S. Cl.
USPC .................................... 438/27; 257/E21.502

(58) Field of Classification Search
USPC ...................................................... 438/26, 27
See application file for complete search history.

(56) References Cited

U.S. PATENT DOCUMENTS 8,279,615 B2 * 10/2012 Schmid et al. ................ 361/752
2012/0241804 A1 * 9/2012 Pyeon ............................ 257/99

* cited by examiner

*Primary Examiner* — William D Coleman
(74) *Attorney, Agent, or Firm* — Altis Law Group, Inc.

(57) ABSTRACT

A method for manufacturing an LED is disclosed. Firstly, a base with two leads is provided. The base has a cavity defined in a top face thereof and two holes defined in two lateral faces thereof. The two holes communicate the cavity with an outside environment. A chip is fixed in the cavity and electrically connected to the two leads. A cover is placed on the top face of the base to cover the cavity. An encapsulation liquid is filled into the cavity through one hole until the encapsulation liquid joins a bottom face of the cover. Finally, the encapsulation liquid is cured to form an encapsulant. A top face of the cover functions as a light emergent face of the LED.

19 Claims, 7 Drawing Sheets

METHOD FOR MANUFACTURING LED

BACKGROUND

1. Technical Field

The present disclosure relates to a method for manufacturing light emitting devices, and more particularly, to a method for manufacturing an LED (light emitting diode), wherein a profile of a light emergent face of the LED can be easily controlled.

2. Description of Related Art

As a new type of light source, LEDs are widely used in various applications. An LED often includes a base having a cavity defined therein, a pair of leads fixed in the base, a light emitting chip received in the cavity to electrically connect the two leads, and an encapsulant filling the cavity to seal the chip. Typically, the encapsulant is formed in the cavity by injecting an encapsulation liquid into the cavity and then heating the liquid to become cured and solid. Thus, the encapsulant becomes rigid to form a light emergent face with a predetermined shape. However, during conversion from liquid to solid, the encapsulant contracts, whereby the light emergent face is recessed. Thus, a concave light emergent face is naturally formed after the encapsulant is cured. The concave degree of the concave light emergent face is difficult to control whereby the concave light emergent face affects the light emergent angle of the LED and causes the light distribution of the LED becoming undesirable. If too much encapsulation liquid is injected into the cavity, a convex light emergent face is formed; like the naturally formed concave light emergent face, the convex degree of the naturally formed convex light emergent is difficult to control, whereby the convex emergent face also undesirably affects the optical characteristics of the LED.

What is needed, therefore, is a method for manufacturing an LED which can overcome the limitations described above.

BRIEF DESCRIPTION OF THE DRAWINGS

Many aspects of the present disclosure can be better understood with reference to the following drawings. The components in the drawings are not necessarily drawn to scale, the emphasis instead being placed upon clearly illustrating the principles of the present disclosure. Moreover, in the drawings, like reference numerals designate corresponding parts throughout the several views.

DETAILED DESCRIPTION OF THE EMBODIMENTS

Referring to FIGS. 1-7, a method for manufacturing an LED 100 in accordance with an embodiment of the present disclosure is shown. The method mainly includes several steps as discussed below.

Figure 1:
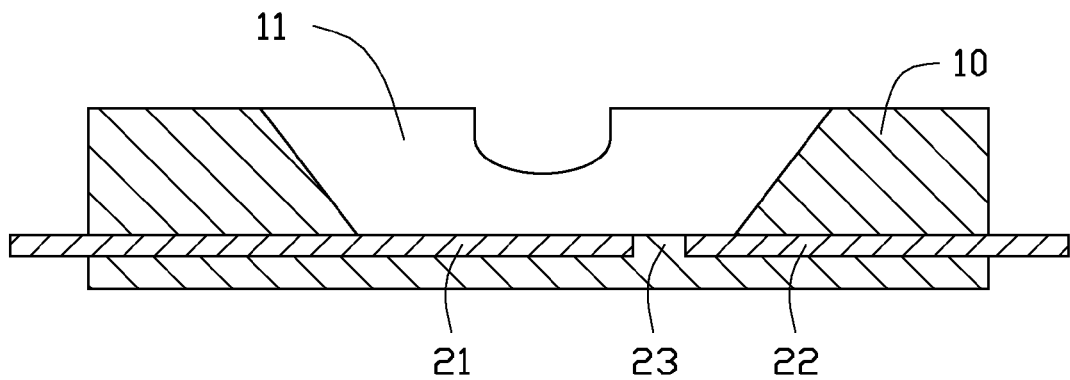
FIG. 1 shows a first step of a method for manufacturing an LED in accordance with an embodiment of the present disclosure.
Figure 2:
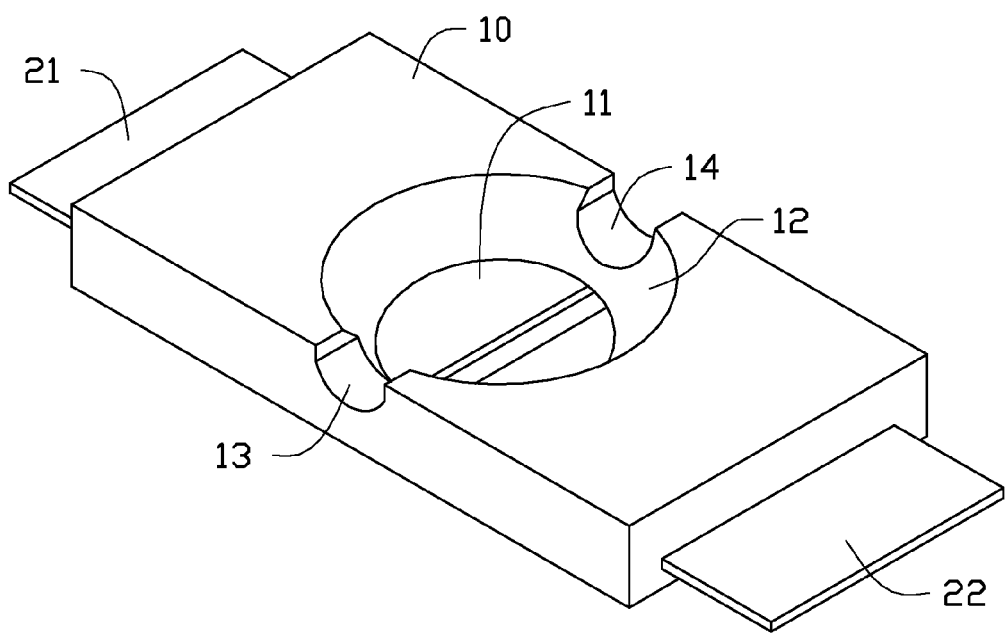
FIG. 2 shows the first step of FIG. 1 from another aspect, wherein a perspective view of a semi-finished LED is illustrated.

Firstly, as shown in FIGS. 1-2, a base 10 with two leads 21, 22 (i.e., a rear lead 21 and a front lead 22) is provided. The base 10 may be made of a single monolithic piece of epoxy, silicon or other suitable electrically insulative materials. The base 10 defines a cavity 11 in a top face thereof. The cavity 11 is circular and located at a central area of the top face of the base 10. An inner circumferential face 12 of the base 10 defining the cavity 11 is a part of a periphery of a cone. Two holes 13, 14 (i.e., a left hole 13 and a right hole 14) are defined in a left face and a right face of the base 10, respectively. The two holes 13, 14 are aligned with each other. Each hole 13, 14 is semicircular and recesses from the top face of the base 10 to form a top opening (not labeled). Each hole 13, 14 also communicates the cavity 11 with an outside environment. The two leads 21, 22 are inserted into the base 10 from a front face and a rear face of the base 10, respectively. The two leads 21, 22 have inner ends (not labeled) exposed within a bottom of the cavity 11 and facing each other, and outer ends extending outwardly beyond the base 10. The two inner ends of the leads 21, 22 are insulated from each other via a spacer 23. The two leads 21, 22 may be made of metal or other suitable electrically conductive materials.

Figure 3:
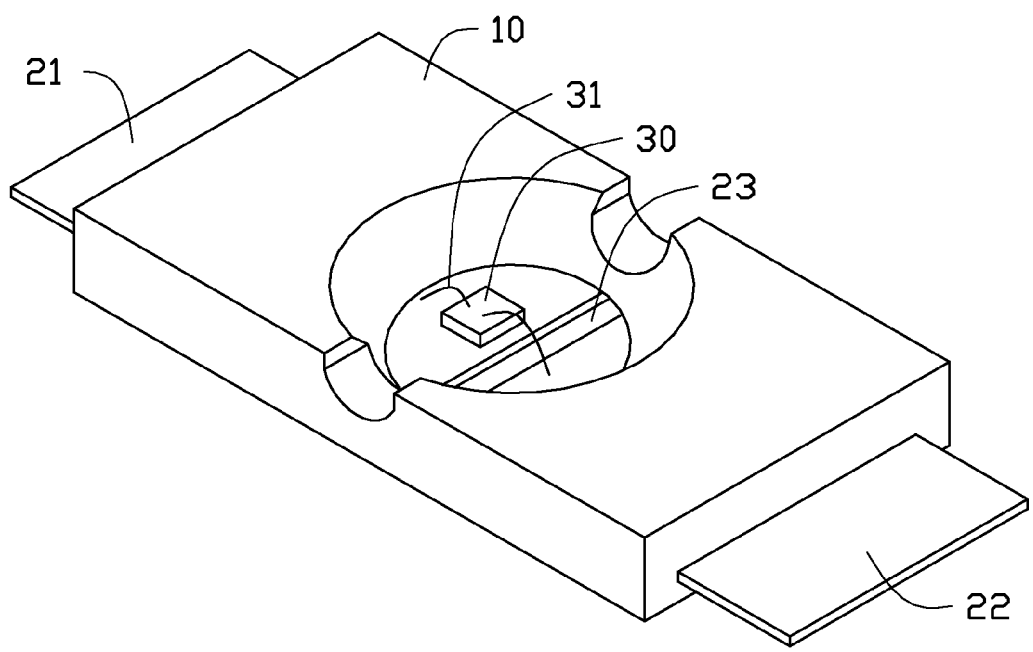
FIG. 3 is a view similar to FIG. 2, showing a second step of the method for manufacturing the LED in accordance with the embodiment of the present disclosure.

A light emitting chip 30 is then fixed in the cavity 11 as shown in FIG. 3. The light emitting chip 30 may be made of semiconductor materials such as GaN, InGaN, AlInGaN. The light emitting chip 30 emits light when being electrified. The light emitting chip 30 is attached on a top face of the inner end of the rear lead 21. Two wires 31 connect the light emitting chip 30 with the two inner ends of the two leads 21, 22. The two holes 13, 14 are located higher than the light emitting chip 30.

Figure 4:
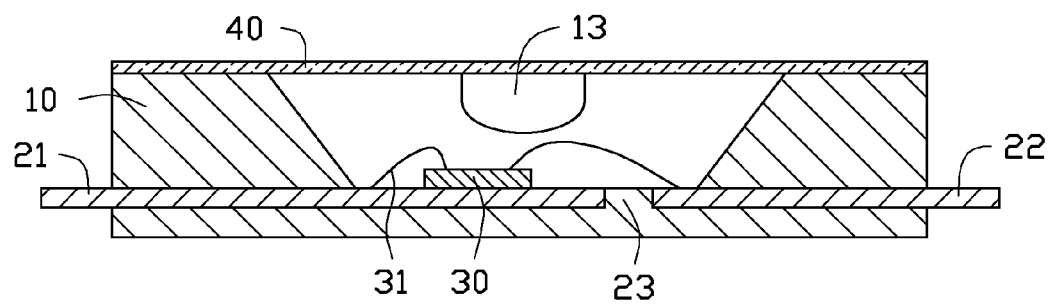
FIG. 4 is a view similar to FIG. 1, showing a third step of the method for manufacturing the LED in accordance with the embodiment of the present disclosure.
Figure 5:
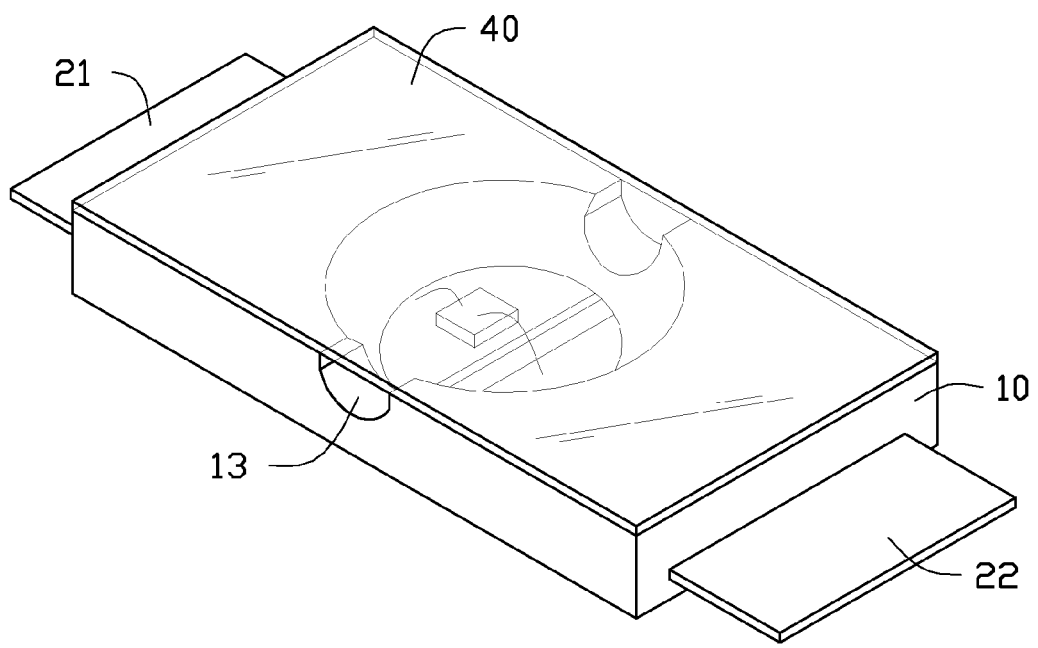
FIG. 5 shows the third step from another aspect.

A cover 40 is further placed on the base 10 as shown in FIGS. 4-5. The cover 40 may be made of transparent materials such as glass, silicone or the like. The cover 40 has a profile similar to the top face of the base 10. The cover 40 is attached on the top face of the base 10 to cover the cavity 11 and the top openings of the two holes 13, 14. The attachment of the cover 40 to the top face of the base 10 may be achieved by gluing. The cavity 11 can only communicate with the outside environment through the two holes 13, 14 after the cover 40 is attached on the base 10.

Figure 6:
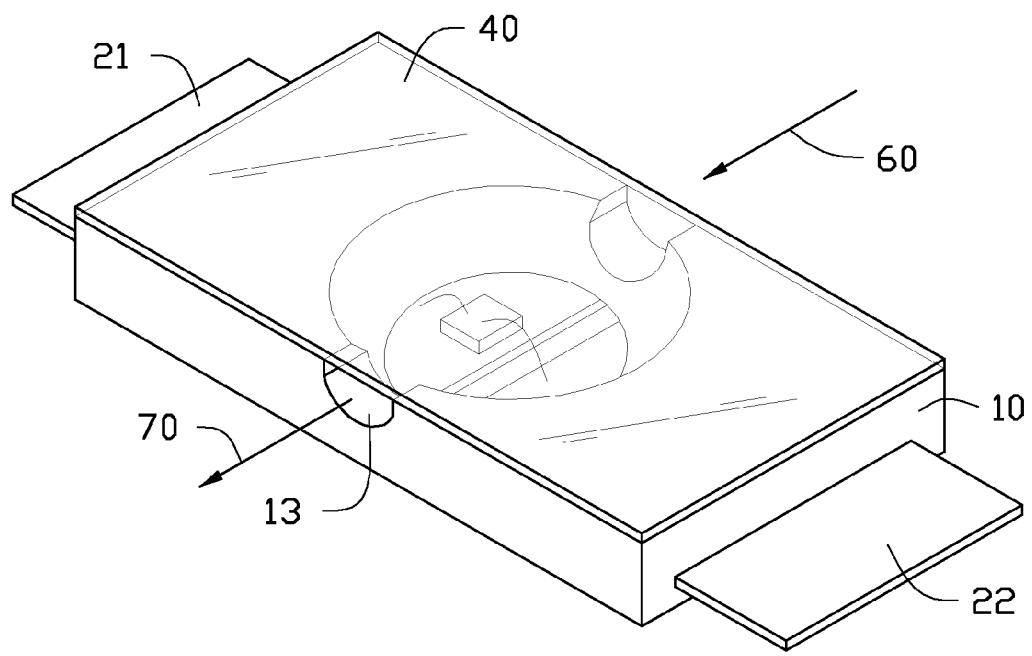
FIG. 6 shows a forth step of the method for manufacturing the LED in accordance with the embodiment of the present disclosure.

As shown in FIG. 6, an encapsulation fluid 60 is filled in the cavity 11. The encapsulation fluid 60 may be made of transparent materials such epoxy or silicone. The encapsulation fluid 60 is injected into the cavity 11 through the right hole 14. During injection of the encapsulation fluid 60 into the cavity 11, air 70 in the cavity 11 is gradually expelled by the encapsulation fluid 60 to exit the cavity 11 from the left hole 13. After the air 70 in the cavity 11 is fully exhausted from the cavity 11, the encapsulation liquid 60 is substantially filled in the whole cavity 11 and contacts a bottom face of the cover 40. In this embodiment, the two holes 13, 14 are defined in the base 10 to act an encapsulation liquid inlet and an air outlet, respectively. Alternatively, only one hole can be defined in the base 10 to simultaneously act as the encapsulation liquid inlet and the air outlet if the hole is large enough.

Figure 7:
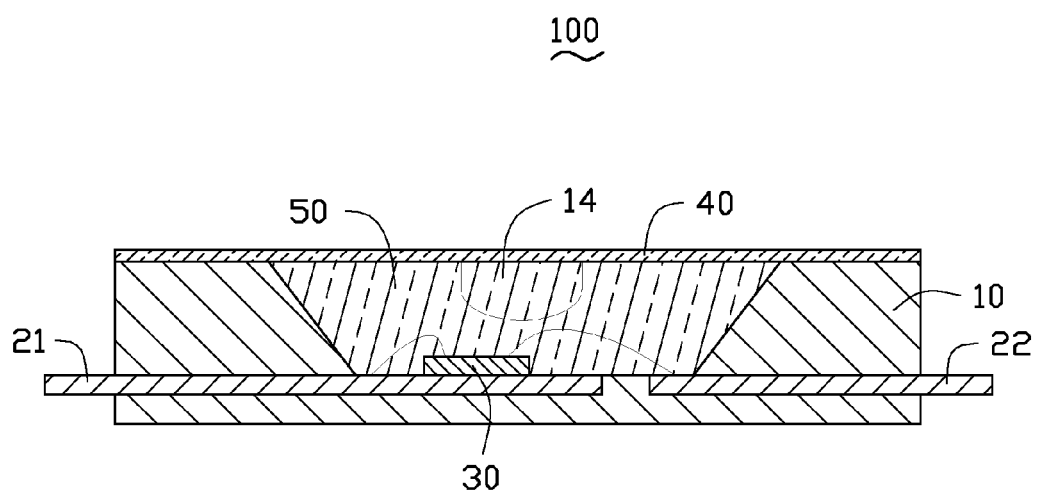
FIG. 7 shows the LED which has been manufactured after the steps of FIGS. 1-6.

Finally, the encapsulation liquid 60 in the cavity 11 is cured under a temperature ranging between 100 to 200 degrees centigrade. The cured encapsulation liquid 11 becomes rigid to form an encapsulant 50 in the cavity 11 as shown in FIG. 7.

The encapsulant 50 fills the two holes 13, 14 to seal the two holes 13, 14. The encapsulant 50 has a refractive index larger than that of the cover 40. The encapsulant 50 has a hardness less than that of the cover 40. Since the encapsulation liquid 60 keeps joining the bottom face of the cover 40 during heating, the encapsulant 50 does not form any gap in an interface between the encapsulant 50 and the cover 40. Therefore, the light emergent from the encapsulant 50 and the cover 40 can maintain its predetermined orientation, and the light distribution of the LED 100 will not be affected.

Preferably, the bottom face of the cover 40 is flat and a top face of the cover 40 which functions as a light emergent face of the LED 100 is also flat. Alternatively, the cover 40 can also be changed to have other shapes. For example, the cover 40 may have a flat bottom face and an upwardly curved (convex) top face, or a downwardly curved bottom face and a flat top face, or a flat bottom face and a concave top face, depending on the actual requirements. Since the cover 40 can be easily machined or molded, the convex degree or the concave degree of the top face or bottom face thereof can be easily controlled; thus, the cover 40 will not unfavorably affect the optical characteristics of the LED 100.

It is believed that the present disclosure and its advantages will be understood from the foregoing description, and it will be apparent that various changes may be made thereto without departing from the spirit and scope of the present disclosure or sacrificing all of its material advantages, the examples hereinbefore described merely being preferred or exemplary embodiments.

What is claimed is:

1. A method for manufacturing an LED (light emitting diode), comprising:
    providing a base with two leads fixed to the base, the base defining a cavity in a top face thereof and a hole communicating the cavity with an outside environment;
    fixing a light emitting chip in the cavity and electrically connecting the chip with the two leads;
    attaching a cover on the top face of the base to cover the cavity, wherein the cover has a top face functioning as a light emergent face of the LED;
    filling an encapsulation liquid into the cavity through the hole until the encapsulation liquid joining a bottom face of the cover; and
    curing the encapsulation liquid to an encapsulant sealing the chip.

2. The method for manufacturing the LED of claim 1, wherein the hole is defined in a lateral face of the base.

3. The method for manufacturing the LED of claim 1, wherein the hole is located adjacent to the top face of the base.

4. The method for manufacturing the LED of claim 1, wherein the cover is transparent.

5. The method for manufacturing the LED of claim 1, wherein the cover has a hardness larger than that of the encapsulant.

6. The method for manufacturing the LED of claim 1, wherein the two leads have inner ends exposed within the cavity, the chip being electrically connected to the two inner ends of the two leads.

7. The method for manufacturing the LED of claim 1, wherein the hole is located higher than the chip.

8. The method for manufacturing the LED of claim 1, wherein the top face of the cover is flat.

9. The method for manufacturing the LED of claim 1, wherein the top face of the cover is concave having a controllably concave degree.

10. The method for manufacturing the LED of claim 1, wherein the top face of the cover is convex having a controllably convex degree.

11. The method for manufacturing the LED of claim 2, wherein the hole recesses from the top face of the base, the cover overlaying a top of the hole.

12. The method for manufacturing the LED of claim 11, wherein the base further has another hole defined in another lateral face thereof, the another hole communicating the cavity with the outside environment before filling the encapsulation liquid into the cavity.

13. The method for manufacturing the LED of claim 12, wherein the another lateral face of the base is opposite to the lateral face of the base.

14. The method for manufacturing the LED of claim 12, wherein the another hole acts as an air outlet when the encapsulation liquid is filled into the cavity through the hole.

15. The method for manufacturing the LED of claim 12, wherein the encapsulant fills the hole and the another hole.

16. The method for manufacturing the LED of claim 13, wherein the hole and the another hole are aligned with each other.

17. The method for manufacturing the LED of claim 4, wherein the cover is made of glass.

18. The method for manufacturing the LED of claim 4, wherein the cover has a light refractive index smaller than that of the encapsulant.

19. The method for manufacturing the LED of claim 6, wherein the chip is fixed on one of the two inner ends of the two leads.

\* \* \* \* \*